(12) United States Patent
Abe et al.

(10) Patent No.: US 8,817,152 B2
(45) Date of Patent: *Aug. 26, 2014

(54) SOLID-STATE IMAGING DEVICE, CAMERA, AND ELECTRONIC DEVICE

(75) Inventors: Takashi Abe, Kanagawa (JP); Ryoji Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/419,008

(22) Filed: Mar. 13, 2012

(65) Prior Publication Data

US 2012/0224090 A1 Sep. 6, 2012

Related U.S. Application Data

(63) Continuation of application No. 12/314,674, filed on Dec. 15, 2008, now Pat. No. 8,134,625.

(30) Foreign Application Priority Data

Feb. 15, 2008 (JP) ................ P2008-035361

(51) Int. Cl.
*H04N 5/335* (2011.01)
*H04N 5/357* (2011.01)
*H01L 27/146* (2006.01)

(52) U.S. Cl.
CPC ........ *H04N 5/3572* (2013.01); *H01L 27/14603* (2013.01)
USPC ......................................... 348/308; 257/294

(58) Field of Classification Search
CPC ....... H04N 3/155; H04N 5/378; H04N 5/335; H04N 5/3572; H01L 27/14603

USPC ................... 348/294, 308; 257/72, 291–294, 257/431–443

See application file for complete search history.

(56) References Cited

U.S. PATENT DOCUMENTS

| | | | |
|---|---|---|---|
| 7,236,198 B2* | 6/2007 | Juen | 348/308 |
| 8,134,625 B2* | 3/2012 | Abe et al. | 348/308 |

FOREIGN PATENT DOCUMENTS

| | | | |
|---|---|---|---|
| JP | 06-283694 A | 10/1994 | |
| JP | 07-066382 A | 3/1995 | |
| JP | 11-204768 | 7/1999 | |
| JP | 2003-230055 | 8/2003 | |
| JP | 2004-104203 | 4/2004 | |
| JP | 2004-282236 A | 10/2004 | |
| JP | 2005-216886 | 8/2005 | |
| JP | 2005-269471 | 9/2005 | |
| JP | 2007-243093 A | 9/2007 | |
| JP | 2007-243094 A | 9/2007 | |

OTHER PUBLICATIONS

Japanese Office Action issued Aug. 31, 20102 for related Japanese Application No. 2008-035361.

* cited by examiner

*Primary Examiner* — Huy K Mai
(74) *Attorney, Agent, or Firm* — Rader, Fishman & Grauer PLLC

(57) ABSTRACT

Disclosed is a solid-state imaging device which includes an imaging region including pixels arranged two-dimensionally, each of the pixels including a photoelectric conversion element and a plurality of pixel transistors for reading out signals outputted from the photoelectric conversion element, and wirings formed on stacked layers for driving each of the pixels. A shading part between the pixels is formed by combining first and second wirings selected from the wirings.

19 Claims, 14 Drawing Sheets

SOLID-STATE IMAGING DEVICE, CAMERA, AND ELECTRONIC DEVICE

CROSS REFERENCES TO RELATED APPLICATIONS

The present invention is a Continuation application of application Ser. No. 12/314,674, filed Dec. 15, 2008, now U.S. Pat. No. 8,134,625 and contains subject matter related to Japanese Patent Application JP 2008-035361 filed in the Japanese Patent Office on Feb. 15, 2008, the entire contents of which being incorporated herein by reference.

BACKGROUND OF THE INVENTION

1. Field of the Invention

The invention generally relates to solid-state imaging devices, cameras, and electronic devices. More particularly, the invention relates to a solid-state imaging device including in a pixel a convertor for converting electric charges generated by a photoelectric conversion element to pixel signals, such as CMOS image sensor, for example. The invention also relates to a camera and an electronic device each provided with the solid-state imaging device. The CMOS image sensor is referred herein to an image sensor fabricated at least partially utilizing the CMOS process.

2. Description of the Related Art

A CMOS image sensor is a solid-state imaging device provided by including a plurality of pixels arranged two-dimensionally, each pixel including a photoelectric conversion element and several pixel transistors or so-called MOS transistors, and by being configured to convert electric charges generated by the photoelectric conversion element to image signals to be readout subsequently. In recent years, the CMOS image sensor has been attracting much attention, as its application spread to various imaging devices such as cameras for use in mobile phone, digital still cameras, digital camcorders, and other similar devices.

FIG. 1 illustrates an example of a CMOS image sensor generally known. The CMOS image sensor 1 is provided, for example, by including an imaging section 4 which has a plurality of pixels 3 (unit cells) arranged in a two-dimensional array, each of the pixels including a photodiode serving as photoelectric conversion element 2 and several pixel transistors (MOS transistors), and by including peripheral circuits.

On receiving light with the photoelectric conversion element 2, signal charges generated by the photoelectric conversion are accumulated. These pixel transistors are provided in the present example as four-transistor circuit configuration including a transfer transistor 6, a reset transistor 7, an amplifying transistor 8, and a selection transistor 9. The transfer transistor 6 serves as the transistor for transferring signal charges accumulated in the photoelectric conversion element 2 to a floating diffusion (FD), i.e., the gate of the amplifying transistor 8. The reset transistor 7 is the transistor for resetting gate potential of the amplifying transistor 8. The amplifying transistor 8 is for amplifying the signal charges. The selection transistor 9 is for selecting an output pixel.

In a pixel 3, the source of the transfer transistor 6 is connected to the photoelectric conversion element 2, and the drain of the transfer transistor is connected to the source of the reset transistor 7. To the gate of the transfer transistor 6, a transfer signal wiring 11 is connected to control the gate potential of the transfer transistor. For the reset transistor 7, the drain thereof is connected to the source voltage supply line (hereinafter referred to as power supply wiring) 10 and the gate thereof is connected to a reset signal wiring 12 for controlling the gate potential. For the amplifying transistor 8, its drain is connected to the power supply wiring 10, its source is connected to the drain of the selection transistor 9, and its gate is connected to the floating diffusion (FD) between the transfer transistor 6 and the reset transistor 7. For the selection transistor 9, its source is connected to the pixel output line 14 and its gate is connected to the selection signal wiring 13 for controlling gate potential.

A transistor 16 for supplying a constant current is connected to the pixel output line 14 so as to supply a constant current to a selected amplifying transistor 8, operate the amplifying transistor 8 as the source follower, and make potential be generated onto the pixel output line 14 such that this potential has a certain fixed voltage difference relative to the gate potential of the transistor 8. To the gate of the transistor 16, a constant potential supply line 17 is connected for supplying fixed potential such that the transistor 16 operates in the saturation region for supplying a fixed current.

The numeral 32 represents ground potential for controlling the potential of semiconductor well region for suitably forming the pixel, while the numeral 33 represent a ground wiring.

On the other hand, a vertical selection unit 21, a column selection unit 22, and a CDS (correlated double sampling) circuit 23 are provided as the peripheral circuits. In addition, disposed for each row of the pixels 3 are a row selection AND circuit 25 having the output terminal thereof connected to the transfer signal wiring 11, another row selection AND circuit 26 having the output terminal thereof connected to the reset signal wiring 12, and still another row selection AND circuit 27 having the output terminal thereof connected to the selection signal wiring 13.

To one input terminal of the row selection AND circuit 25 in each row, a pulse terminal 28 is connected for supplying a transfer pulse to the transfer signal wiring 11, while an output from the vertical selection unit 21 is connected to the other input terminal of the AND circuit 25. To one input terminal of the row selection AND circuit 26 in each row, a pulse terminal 29 is connected for supplying a reset pulse to the reset signal wiring 12, while the output from the vertical selection unit 21 is connected to the other input terminal. To one input terminal of the row selection AND circuit 27 in each row, a pulse terminal 30 is connected for supplying a selection pulse to the selection signal wiring 13, while the output from the vertical selection unit 21 is connected to the other input terminal.

With such configuration, each control pulse is supplied only to the signal wirings connected to the row selected by the vertical selection unit 21. The readout operation from each pixel 3 is carried out as follows by applying drive signals shown in FIG. 2.

A transfer signal (pulse) S1 shown in FIG. 2 is supplied to the transfer signal wiring 11, a reset signal (pulse) S2 is supplied to the reset signal wiring 12, and a selection signal (pulse) S3 is supplied to the selection signal wiring 13.

First, by supplying a selection pulse S3 and a reset pulse S2, the selection transistor 9 and the reset transistor 7, which are connected to the row to be presently readout, are brought to the conduction state, and the potential of the gate (so-called floating diffusion FD) of the amplifying transistor 8 is reset. After turning the reset transistor 7 to be non-conductive, the voltage corresponding to the reset level of each pixel 3 is readout to the CDS circuit 23 at the subsequent stage. Next, by supplying a transfer pulse S1, the transfer transistor 6 is turned to be conductive, and the charges accumulated in the photoelectrical conversion element 2 are transferred to the floating diffusion, i.e., the gate of the amplifying transistor 8. Subsequent to the charge transfer, the transfer transistor 6 is brought to the non-conduction state and the voltage at the signal level corresponding to the amount of accumulated charges is readout to the CDS circuit 23 at the subsequent stage.

With the CDS circuit 23, the difference between the reset level readout previously and the signal level is computed, whereby fixed pattern noise is offset, which may be generated in the amplifying transistor by the variation of threshold voltage Vth and similar factors for each pixel. Upon selected by the column selection unit 22, the signals accumulated in the CDS circuit 23 are readout thorough the horizontal signal wiring 24 to the circuit at the subsequent stage such as AGC (automatic gain control) and the like, and are processed subsequently.

The wirings shown in FIG. 1 are formed using a plurality of metal wirings. These wirings are the drive wirings such as the transfer signal wiring 11, reset signal wiring 12, and selection signal wiring 13; the signal output wirings such as the pixel output wiring 14, and horizontal signal wiring 24; the power supply wiring 10; and the ground wiring 33. For example, the pixel output wiring 14 to be formed in the vertical direction is formed on the first layer; the drive wirings such as the transfer signal wiring 11, reset signal wiring 12, and selection signal wiring 13 to be formed in the vertical direction, and the ground wiring 33, are formed on the second layer; and the power supply wiring 10 is formed on the third layer.

In addition, in order to connect the power supply wiring 10 and drive wirings with the diffusion region and gate electrode used as the source or drain of the pixel transistor, the connections are provided from the third layer to the second layer, from the second layer to the first layer, and from the first layer to the diffusion region and gate electrode, successively, via through-holes formed in insulating interlayers. In the front-illuminated CMOS image sensor which is configured to focus light through these plural metal wirings onto the photoelectric conversion element, by forming the wirings so as to avoid immediate above the photoelectric conversion element, vignetting caused by the metal wiring is reduced and the focusing efficiency is increased. With the increase in the number of wiring layers, the decrease in the focusing efficiency is generally inevitable from the increase in costs and aspect ratio.

As a further role of the metal wiring, blocking light between pixels can be cited. On reaching the surface of image sensor, light beams are focused onto each photoelectric conversion element through on-chip lens. However, when the incidence angle of the beams is large, there arises the possibility of the light beams to be incident deflected onto the location other than the originally intended photoelectric conversion element. In the case where the beams enter the next photoelectric conversion element, color mixing takes place and the degradation in image quality arises such as the decrease in image resolution, for example. By contrast, by disposing metal wirings between the photoelectric conversion elements, the color mixing to neighboring pixels is suppressed and the degradation in image quality can be prevented. In addition, another structure including dummy wirings is also proposed for the shading between pixels (cf. Japanese Unexamined Patent Application Publication No. 2005-277404).

FIG. 3 is a schematic view illustrating the previously known wiring structure included in the imaging section. Referring to FIG. 3, wirings are formed with a three-layer structure. That is, a pixel output wiring 14 is formed of metal wiring extending in the vertical direction on a first layer. A transfer signal wiring 11, reset signal wiring 12, and selection signal wiring 13 used as drive wirings, and a ground wiring 33 are formed of metal wirings extending in the horizontal direction in parallel to each other on a second layer. A power supply wiring 10 is formed of metal wiring to be in the shape of lattice on a third layer. In order to connect the power supply wiring and drive wirings with diffusion regions and gate electrodes of the pixel transistors, the connections are provided in practice, as mentioned earlier, from the third layer to the second layer, from the second layer to the first layer, and then from the first layer. However, the details thereof are omitted here in the drawing. The power supply wiring 10 on the third layer also serves the role of shading between the pixels.

In addition, another wiring circuit of a CMOS solid-state imaging device is described in Japanese Unexamined Patent Application Publication No. 2003-230055, shading films included in CCD solid-state imaging device are described in Japanese Unexamined Patent Application Publication No. 2005-216886 and Japanese Unexamined Patent Application Publication No. Heisei 11 (1999)-204768, and further shading films included in a CMOS solid-state imaging device are described in Japanese Unexamined Patent Application Publication No. 2004-104203.

SUMMARY OF THE INVENTION

In a CMOS image sensor, several wirings in the pixel array are provided using metal wirings for driving pixel transistors, pixel output, power supply, and grounding circuits. In the so-called front-illuminated CMOS image sensor in which light is incident on the photoelectric conversion element from the side provided with wirings formed thereon, it may be necessary to prevent the decrease in sensitivity caused by vignetting due to wirings. In addition, in order to improve the sensitivity by increasing the focusing efficiency, it is desirable to reduce a device height by reducing the distance between the photoelectric conversion element and on-chip lens.

With regard to the wiring structure of FIG. 3, there is concern about the effects of signal delay caused by parasitic resistance and capacitance of the wiring itself and about the occurrence of the shading. These may result in the degradation of image quality. For example, in a CMOS image sensor with large optical size, parasitic resistance and capacitance of wiring may be concerned. The characteristics of the pixel vary with the location in the imaging region, and the degradation of image quality due to the shading and the like may take place. Particularly, since the power supply wiring and ground wiring have relatively strong influence on the output, the wirings having low resistance and capacitance are highly desirable. On the other hand, metal wirings are also used for shading between pixels to suppress the color mixing. In order to meet these requirements and desirable characteristics, it is important to increase the flexibility of metal wiring as a whole.

Since the shading between pixels is implemented using the power supply wiring formed in the shape of lattice, as mentioned above, the focusing efficiency is improved and the sensitivity can be increased by enlarging each opening of the lattice. However, since four wirings with metal wirings are formed on the second layer extending in the horizontal direction in parallel to each other, the wiring density becomes high and it follows that some portions of the wirings, i.e., the transfer signal wiring 11 and the ground wiring 33 on the second layer on both outer sides shown in FIG. 3, in the present example, are formed protruding out to openings 10A defined by the lattice-shaped power supply wiring 10, even after reducing the line width of each wiring. As a result, actual opening area is reduced and the sensitivity is decreased accordingly. In addition, the shading may tend to occur with relative ease as a result of increased parasitic resistance of the wiring.

Since the wiring density is high with these four wirings, the distance between the drive wirings and neighboring ground wiring 33 is small, causing the coupling capacity between both wirings to be large and fluctuation of the ground potential to be generated with relative ease. Increased parasitic resistance resulted from decreased wiring width also affects the occurrence of the fluctuation of ground potential. The fluctuation of ground potential may be detected as noise.

It is desirable to provide a solid-state imaging device with improved sensitivity and image quality, a camera provided with the solid-state imaging device, and an electronic device provided with the camera.

According to an embodiment of the invention, there is provided a solid-state imaging device. The solid-state imaging device includes an imaging region including a plurality of pixels arranged two-dimensionally, each of the pixels including a photoelectric conversion element and a plurality of pixel transistors for reading out signals outputted from the photoelectric conversion element, and stacked wirings for driving each of the pixels. In the solid-state imaging device, a shading part between the pixels is formed by combining a plurality of different wirings selected from the stacked wirings.

According to an embodiment of the invention, there is provided a camera. The camera includes a solid-state imaging device; an optical system configured to lead incident light to a photoelectric conversion element included in the solid-state imaging device; and a signal processing circuit configured to process output signals from the solid-state imaging device. The solid-state imaging device includes an imaging region including a plurality of pixels arranged two-dimensionally, each of the pixels including a photoelectric conversion element and a plurality of pixel transistors for reading out signals outputted from the photoelectric conversion element, and stacked wirings for driving each of the pixels. In the solid-state imaging device, a shading part between the pixels is formed by combining a plurality of different wirings selected from the stacked wirings.

According to an embodiment of the invention, there is provided an electronic device. The electronic device includes a camera. The camera includes a solid-state imaging device, an optical system configured to lead incident light to a photoelectric conversion element included in the solid-state imaging device, and a signal processing circuit configured to process output signals from the solid-state imaging device. The solid-state imaging device includes an imaging region including at least a plurality of pixels arranged two-dimensionally, each of the pixels including a photoelectric conversion element and a plurality of pixel transistors for reading out signals outputted from the photoelectric conversion element, and stacked wirings for driving each of the pixels. In the solid-state imaging device, a shading part between the pixels is formed by combining a plurality of different wirings selected from the stacked wirings.

In the solid-state imaging device according to an embodiment of the present invention, since the shading part is formed by combining a plurality of different wirings selected from the stacked wirings, the wiring density on other layers is reduced and the area of the openings defined by the lattice-shaped shading parts, which are formed by combining the plurality of wirings, can be increased. In addition, the reduction in resistance as well as capacitance can be achieved for the above-mentioned wirings also provided for the shading and for other wirings.

In the solid-state imaging device according to an embodiment of the present invention, since the area of the openings defined by lattice-shaped shading parts, which are formed by combining a plurality of different wirings selected from the stacked wirings is increased, the focusing efficiency is increased and the sensitivity can be improved. In addition, as a result of the decrease in resistance and capacitance presently achieved, the degradation of image quality caused by the shading and the like can be suppressed, i.e., image quality is improved.

The camera according to an embodiment of the present invention incorporates the abovementioned solid-state imaging device. Therefore, picture images of high sensitivity and high quality can be obtained.

The electronic device according to an embodiment of the present invention incorporates the abovementioned camera capable of providing picture images of high sensitivity and high quality. Therefore, the high performance of the electronic devices can be achieved.

DESCRIPTION OF THE PREFERRED EMBODIMENTS

Embodiments of the present invention will be described hereinbelow by referring to the accompanying drawings.

A solid-state imaging device according to an embodiment of the present invention may be a typical front-illuminated CMOS image sensor. Although examples of the solid-state imaging device according to an embodiment of the invention are described hereinbelow with the illustration assuming the aforementioned configuration diagrammatically shown in FIG. 1, it is not intended to limit the invention to the illustration and accompanied drawings.

Figure 1:
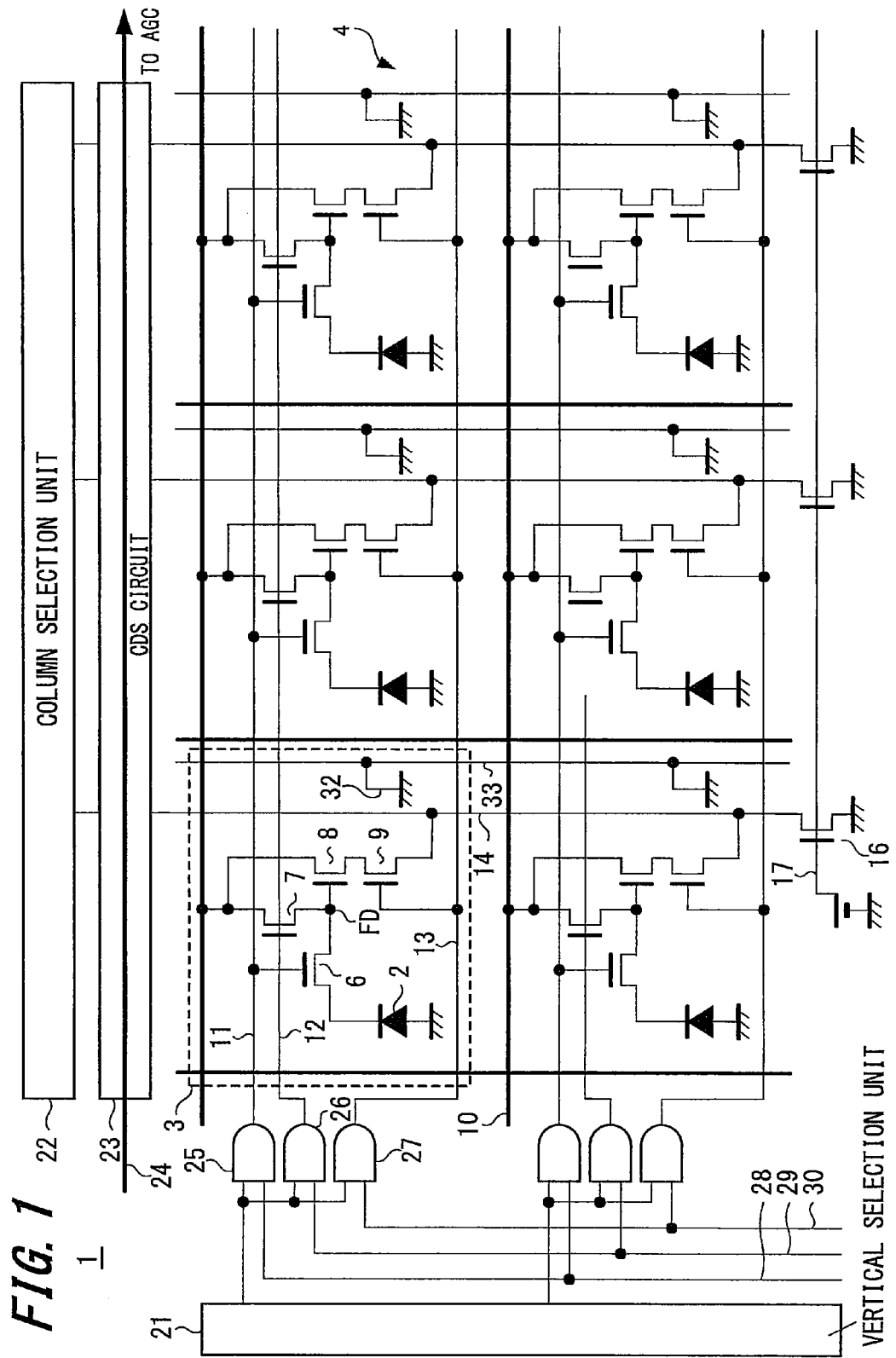
FIG. 1 is a schematic diagram illustrating an example of a CMOS image sensor.
Figure 2:
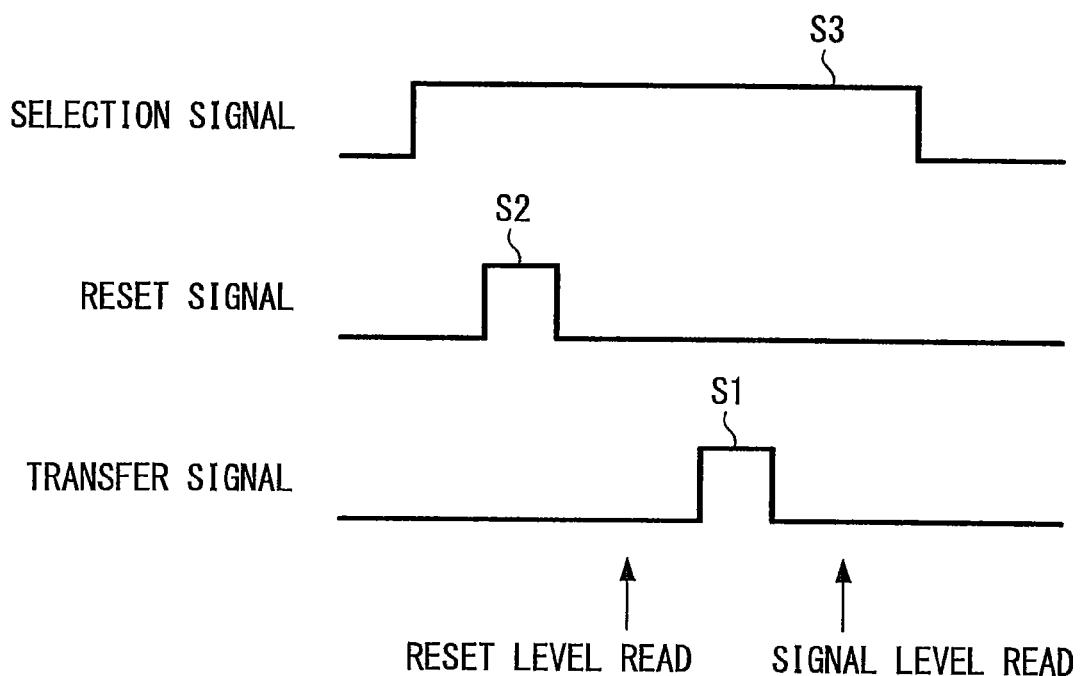
FIG. 2 is a signal wave diagram of drive signals applied to the CMOS image sensor of FIG. 1.

The schematic configuration of the solid-state imaging device as a CMOS image sensor according to an embodiment of the invention is similar to that illustrated in FIG. 1. That is, the solid-state imaging device according to the present embodiment includes an imaging section and peripheral circuits disposed around the imaging section. The imaging section includes a plurality of pixels (unit cells) arranged in a two-dimensional array, in which each of the pixels includes, for example, a photodiode serving as photoelectric conversion element and several pixel transistors (MOS transistors). These pixel transistors in the example of FIG. 1 include four transistors such as a transfer transistor, a reset transistor, an amplifying transistor, and a selection transistor.

A transfer signal wiring is connected to the gate of the transfer transistor, a reset signal wiring is connected to the gate of the reset transistor, and a selection signal wiring is connected to the gate of the select transistor. A pixel output line is connected to the source of the selection transistor. In addition, a power supply wiring is connected to the drains of both the reset transistor and the amplifying transistor. Further, a ground wiring is provided. These wirings are formed of metal in a structure of a plurality of layers stacked through insulating interlayers on the surface side of a substrate where the photoelectric conversion element is formed.

An on-chip color filter and on-chip lens are formed above the plurality of wiring layers through a planarization layers.

On the other hand, a vertical selection unit, a column selection unit, a CDS (correlated double sampling) circuit, etc. are provided as the peripheral circuits. Furthermore, disposed for each row of the pixels are a row selection AND circuit having the output terminal thereof connected to the transfer signal wiring, another row selection AND circuit having the output terminal thereof connected to the reset signal wiring, and still another row selection AND circuit having the output terminal thereof connected to the selection signal wiring.

Since other features and operations are similar to those shown in FIG. 1, the repeated description thereof is herewith omitted.

Figure 4:
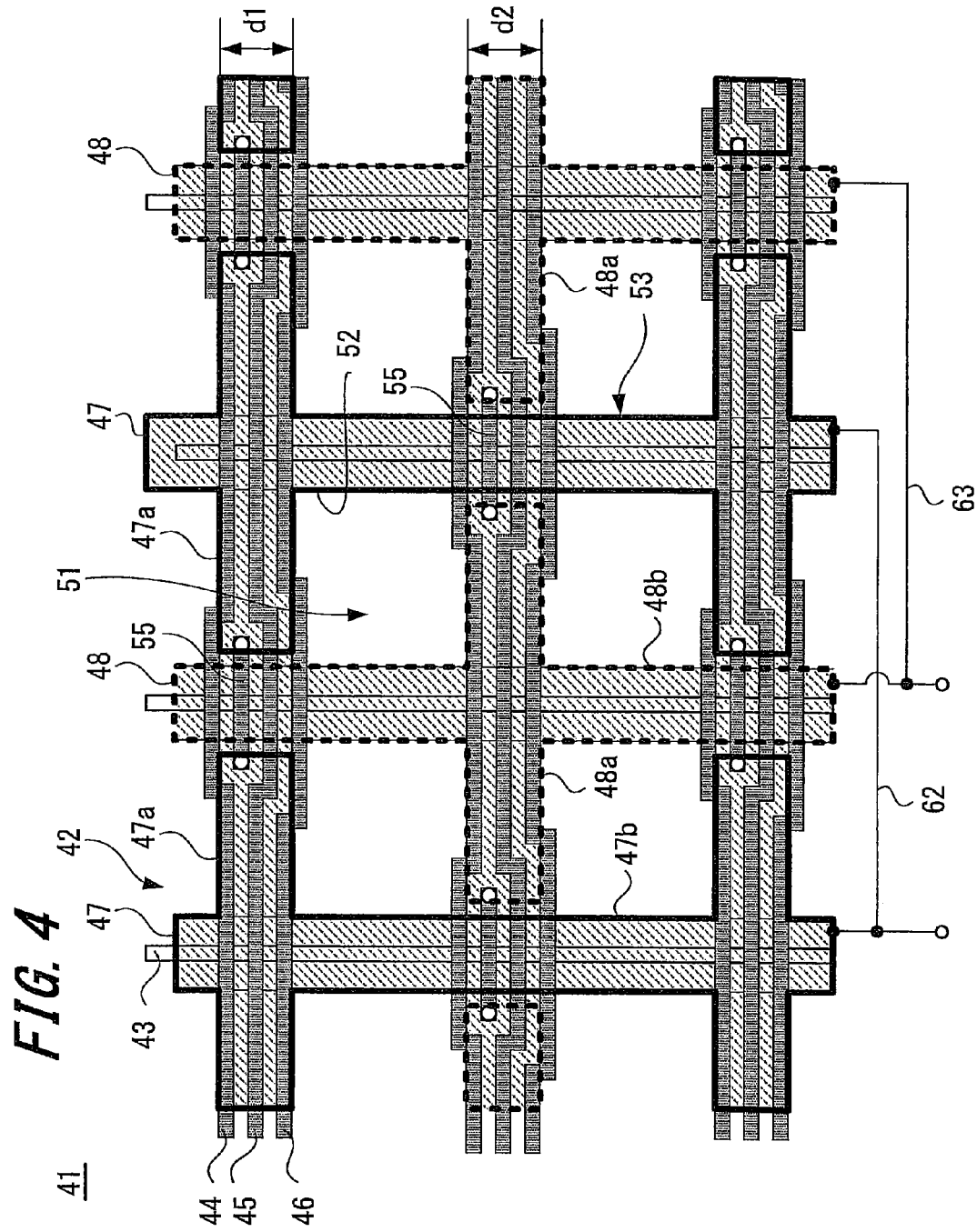
FIG. 4 is a schematic diagram illustrating a first example of major portions of a solid-state imaging device according to an embodiment of the present invention.

In addition, the feature of the solid-state imaging device according to an embodiment of the present embodiment is a wiring structure employed in the plurality of wirings. FIG. 4 is a schematic diagram of a solid-state imaging device according to an embodiment of the present invention, particularly illustrating a first example of the wiring structure in detail. A solid-state imaging device 41 of the first example is provided with an imaging section 42 which includes a pixel output wiring 43 formed of metal wiring extending in the vertical direction on a first layer; and a transfer signal wiring 44, reset signal wiring 45, and selection signal wiring 46 each formed of metal wirings in parallel to each other extending in the horizontal direction on a second layer. Also in this example, a power supply wiring 47 and a ground wiring 48 are each formed with metal wirings on a third layer to be in a lattice shape partially apart from each other.

The power supply wirings 47 are formed in the shape of lattice with horizontal crosspiece portions 47a thereof each separated in the middle as a first lattice structure, and the ground wirings 48 are similarly formed in the shape of lattice with horizontal crosspiece portions 48a thereof each separated in the middle as a second lattice structure. These power supply wiring 47 and ground wiring 48 are arranged to form a combination so that vertical crosspiece portions 48b of the second lattice structure and vertical crosspiece portions 47b of the first lattice structure are disposed mutually to be accommodated spatially in the abovementioned separated portions of power supply wirings 47 and ground wirings 48, respectively. With these power supply wirings 47 and ground wirings 48, shading portions 53 are formed in the shape of lattice, which provide openings 52 each formed at the locations spatially corresponding to photoelectric conversion elements 51 included in pixels.

In addition, first and second pairs of horizontal crosspieces, 47a and 48a, which are previously separated from the power supply wiring 47 and ground wiring 48, respectively, are interconnected in the pair using connection wirings 55 which are formed with metal wiring on the second layer, at intersecting locations where the directions of the power supply wiring 47 and ground wiring 48 come to intersect each other.

The transfer signal wiring 44, reset signal wiring 45, and selection signal wiring 46, which are formed of metal wirings extending horizontally on the second layer, are provided in parallel to each other within the line widths, d1 and d2 (d1=d2, in the present example), of horizontal crosspiece portions, 47a and 48a, for the power supply wirings 47 and ground wirings 48, respectively, each being formed as lattice structures. However, since the connection wirings 55 are formed at the abovementioned intersecting locations of the power supply wiring 47 and ground wiring 48, the portions of the wirings provided on both outer sides, i.e., the portions of the transfer signal wiring 44 and selection signal wiring 46 in the present example, are formed to protrude from the abovementioned line widths partially into the area of the openings 52 in the vicinity of the intersecting locations.

According to the first example of wiring structure of the solid-state imaging device 41 of an embodiment of the invention, the power supply wiring 47 and ground wiring 48 are each formed with metal wirings on the third layer to be in the lattice shape partially apart from each other, and also the discontinuous portions situated at the intersecting locations of the power supply wiring 47 and ground wiring 48 are interconnected using the connection wirings 55 formed with metal wirings on the second layer. In addition, utilizing the combination of the power supply wirings 47 and ground wirings 48, the shading portions 53 are formed in the shape of lattice. With such a configuration of the solid-state imaging device, image quality can be improved after effectively implementing the shading between the pixels, thereby controlling the color mixing between the pixels. In addition, since the area of the openings 52 facing the photoelectric conversion elements 51 is expanded, the focusing efficiency can be improved and sensitivity is increased as a whole.

Figure 3:
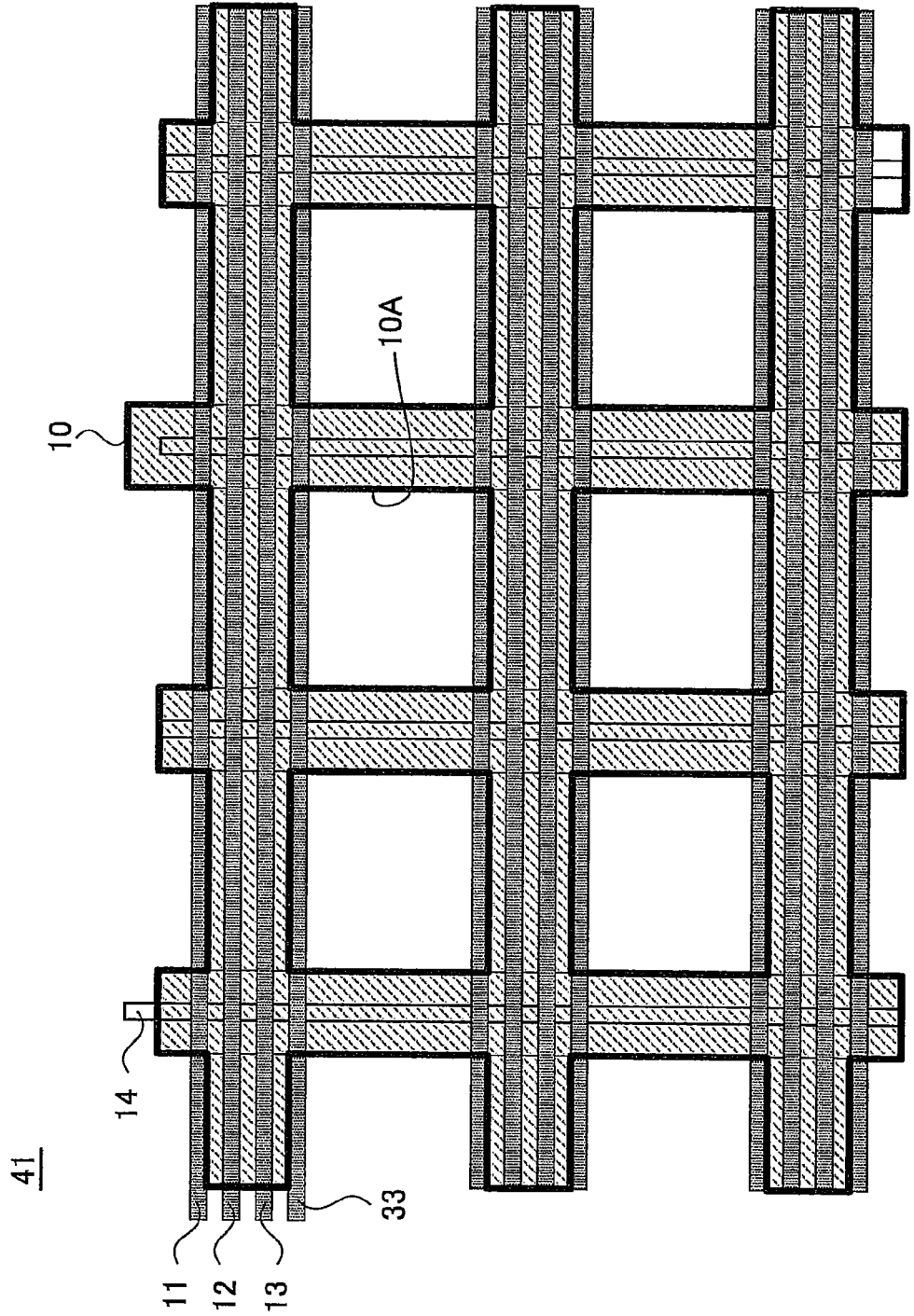
FIG. 3 is a schematic diagram illustrating a wiring structure of a CMOS image sensor according to the related art.

That is, in the case shown in FIG. 3, since the ground wiring 33 and the transfer signal wiring 11 on the second layer are formed protruding out to the area of the openings 10A defined by the lattice shaped power supply wiring 10 on the third layer, the effective area of opening is defined in practice as the area surrounded by the power supply wiring 10, transfer signal wiring 11, and ground wiring 33. In the present example, by contrast, the effective area of opening 52 formed with the wirings, which are also serving for shading, is defined by the area surrounded by the power supply wiring 47 and ground wiring 48 on the third layer, and by the partially protruding wirings on the second layer, e.g., transfer signal wiring 44 and selection signal line 46. Therefore, the area of opening in the present example can be increased as much as the decrease in the area of protruding portions of the wiring on the second layer, and the focusing efficiency can be improved and sensitivity is increased in comparison with the example previously known of FIG. 3.

Since the ground wirings 48 are formed on the third layer, the coupling capacity decreases between the signal wirings on the second layer and the ground wirings 48. In addition, since the ground wirings 48 are formed in the shape of lattice, the wiring parasitic resistance thereof becomes small. Although the connection wirings 55 are formed on the second layer, the coupling capacity between the wiring 55 and the signal wirings adjacent thereto can be held small since wiring length is relatively short. With the present configuration of the wirings, since fluctuation of ground potential is suppressed, the ground potential can be stabilized. As a result of stabilization of the ground potential, the occurrence of noise can be suppressed.

Furthermore, by forming the power supply wirings 47 and ground wirings 48 each in the shape of lattice, the parasitic resistance as well as capacitance of the wiring itself can be held small, the occurrence of shading can be suppressed and the degradation of image quality resulted from the shading can also be suppressed. In addition, since the wiring density on the second layer is reduced compared with the previously known structure, it becomes feasible to achieve low resistance and low capacitance of the wirings. Also, the effects of signal delay are reduced, and the degradation of image quality resulted from the signal delay can be suppressed.

Since the number of layers of wirings is kept as three that is the same as the example of FIG. 3, the reduction in device thickness can be achieved utilizing the relatively small distance between the receiving surface of photoelectric conversion element and the on-chip lens, and device sensitivity can be improved. With such a configuration, the number of wirings on the second layer is decreased and the flexibility can be increased in designing wiring schemes with due consideration to the reduction of vignetting.

In the first example, as mentioned above, the lattice-shaped power supply wirings 47 and ground wirings 48 are each formed with metal wirings on the third layer, and the shading portions 53 are formed in the shape of another lattice utilizing the combination of the power supply wirings 47 and ground wirings 48. In addition, the shading portions 53 may alternatively be provided first by forming a lattice structure of metal wirings on the third layer using any one of signal wirings 44, 45, and 46, and one of the power supply wiring 47 and ground wiring 48, partially apart from each other in a manner similar to FIG. 4; and subsequently by combining these two lattice structures using the connection wiring 55. In this case, the other of the power supply wiring 47 and ground wiring 48 is formed as a further metal wiring on the second layer together with the other signal wirings, which are horizontally extending in parallel to each other.

With the present device configuration as well, the area of the openings in the shading portion can be increased, and the improvement of sensitivity is achieved. In addition, the improvement of image quality can also be implemented as a result of the reduction of resistance and capacitance.

Figure 5:
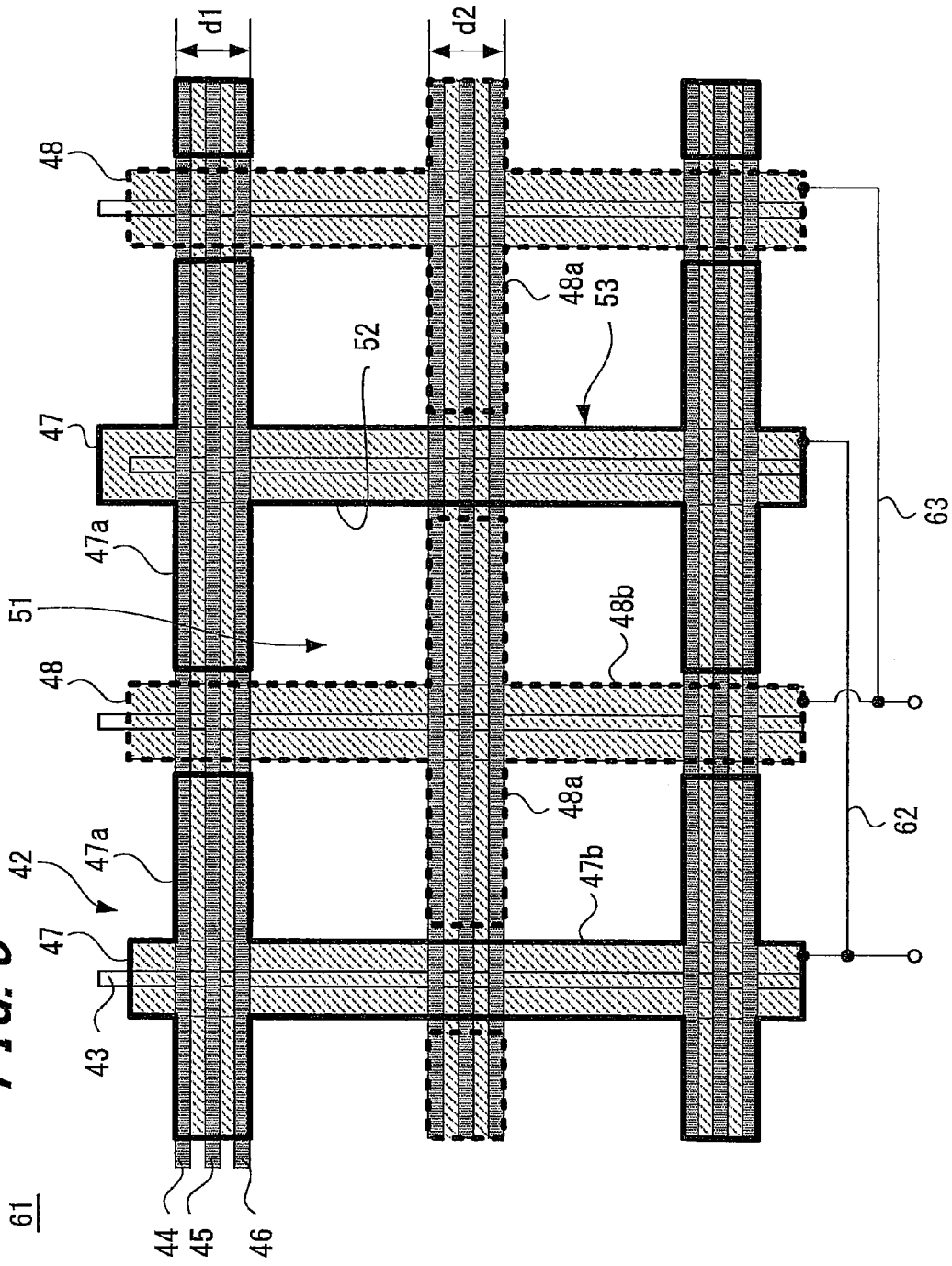
FIG. 5 is a schematic diagram illustrating a second example of major portions of a solid-state imaging device according to an embodiment of the present invention.

FIG. 5 is a schematic diagram of a solid-state imaging device according to an embodiment of the present invention, particularly illustrating a second example of the wiring structure in detail. A solid-state imaging device 61 of the second example is provided with the imaging section 42 which includes the pixel output wiring 43 formed of metal wiring extending in the vertical direction on a first layer; and the transfer signal wiring 44, reset signal wiring 45, and selection signal wiring 46 each formed of metal wirings being in parallel to each other extending in the horizontal direction on a second layer. Also in the present example, the power supply wiring 47 and the ground wiring 48 are each formed with metal wirings on a third layer to be in a lattice shape partially apart from each other.

The power supply wirings 47 are formed in the shape of lattice with horizontal crosspiece portions 47a thereof each being separated in the middle as a first lattice structure, and the ground wirings 48 are similarly formed in the shape of lattice with horizontal crosspiece portions 48a thereof each being separated in the middle as a second lattice structure. These power supply wiring 47 and ground wiring 48 are arranged to form a combination so that vertical crosspiece portions 48b of the second lattice structure and vertical crosspiece portions 47a of the first lattice structure are disposed to be mutually accommodated spatially in the abovementioned separated portions of power supply wirings 47 and ground wirings 48, respectively. With the power supply wirings 47 and ground wirings 48, shading portions 53 are formed in the shape of lattice, which is provided with openings 52 each formed at the portions spatially corresponding to the photoelectric conversion elements 51 of pixels.

In addition, the power supply wirings 47 and ground wirings 48, which are respectively formed in the lattice shape partially apart from each other, are not connected in the manner using connection wirings as described earlier in the first example. Instead, the power supply wirings 47 partially apart from each other in their present shape are interconnected using a wiring 62 at the end portions of the wirings 47, and also the ground wirings 48 partially apart from each other in their present shape are interconnected using a wiring 63 at the end portions of the wirings 48.

The transfer signal wiring 44, reset signal wiring 45, and selection signal wiring 46 on the second layer are formed of metal wirings linearly extending horizontally over the entire device length. The wirings on both sides such as, for example, the transfer signal wiring 44 and selection signal wiring 46 are provided so as not to protrude into the area of the openings 52 which are formed in the shading portions 53 in the shape of lattice as the combination of the power supply wirings 47 and ground wirings 48. Since other features of the device are similar to those described earlier in the first example, the repeated description thereof is herewith omitted.

According to the second example of wiring structure of the solid-state imaging device 61 of an embodiment of the invention, the shading portions 53 in the shape of lattice are formed as the pattern in combination of the power supply wirings 47 and ground wirings 48 with metal wirings on the third layer, and the signal wirings, 44 and 46, on the second layer are formed not to protrude into the area of the openings 52. Therefore, the area of the openings 52 facing the respective photoelectric conversion elements is increased. The area of openings as a whole in the present embodiment can be larger than that of the first example. As a result, the focusing efficiency can be improved and sensitivity is increased.

Since the ground wirings 48 are formed on the third layer, the coupling capacity between the signal wirings on the second layer and the ground wirings 48 decreases, and since the ground wirings 48 are formed in the shape of lattice although partially apart from each other, the wiring parasitic resistance decreases. Therefore, the fluctuation of ground potential is suppressed and the ground potential can be stabilized. As a result of the stabilization of the ground potential, the occurrence of noise can be suppressed.

Furthermore, by forming the power supply wirings 47 and ground wirings 48 each in the shape of lattice, the parasitic resistance as well as the capacitance of the wiring itself can be held small, the occurrence of shading can be suppressed and the degradation of image quality resulted from the shading can also be suppressed. In addition, since the wiring density on the second layer is reduced in comparison with the previously known structure, it becomes feasible to achieve low resistance as well as low capacitance of the wirings. Also, the effects of signal delay are reduced, and the degradation of image quality resulted from the signal delay can be suppressed.

Since the number of layers of wirings is kept as three that is the same as the example of FIG. 3, the reduction in device thickness can be implemented utilizing the relatively small distance between the receiving surface of photoelectric conversion element and the on-chip lens, and the sensitivity can be improved. With such a configuration, the number of wirings on the second layer can be decreased and flexibility can be increased in designing wiring schemes with due consideration to the reduction of vignetting.

Since the portions of the power supply wirings 47 and ground wirings 48 apart from each other in the second example are not interconnected using connection wirings, the configuration of the first example is more advantageous in regard to the reduction of parasitic resistance of the power supply wirings 47 and the ground wirings 48. The configuration of the first example is more advantageous overall than the second example.

Figure 6:
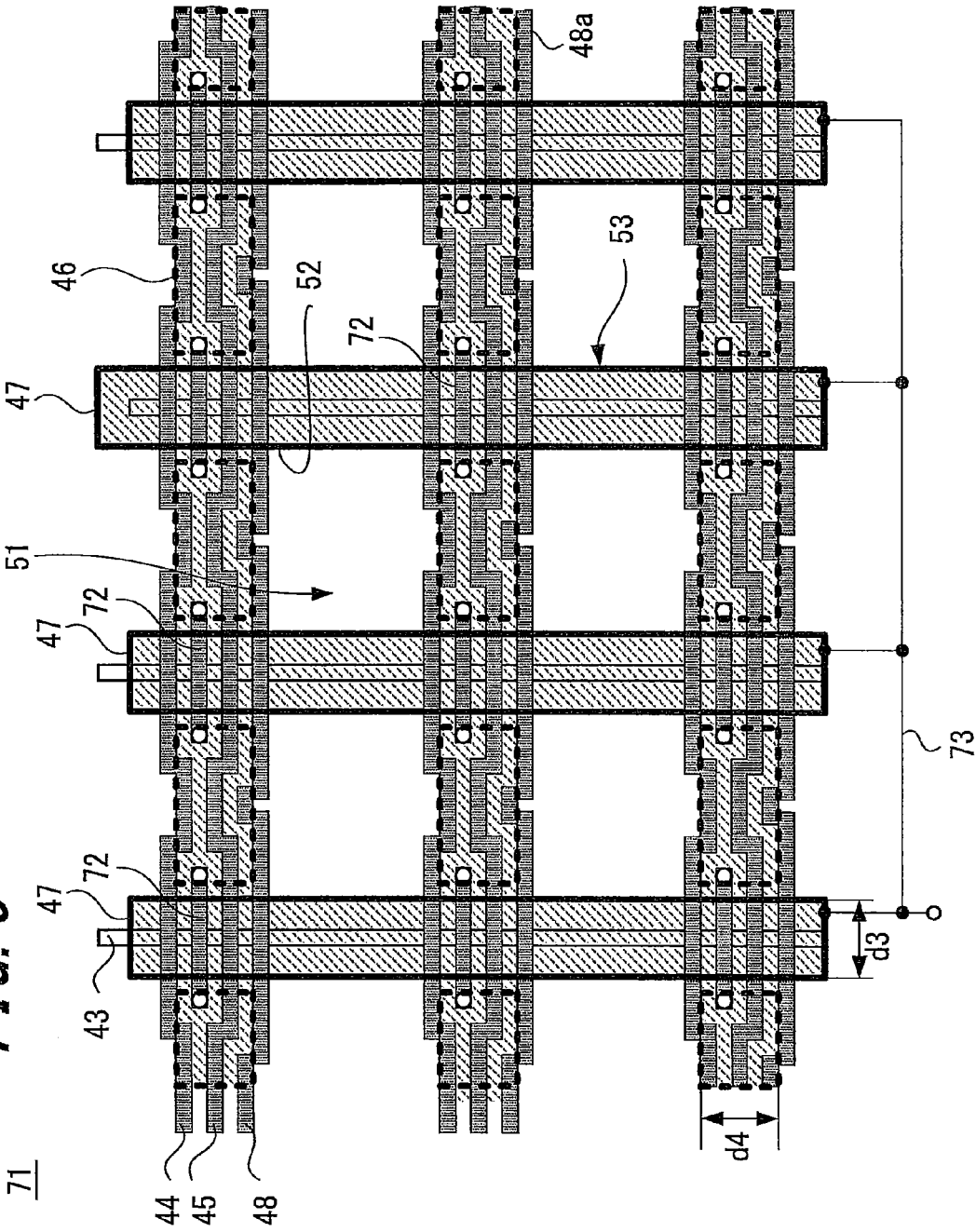
FIG. 6 is a schematic diagram illustrating a third example of major portions of a solid-state imaging device according to an embodiment of the present invention.

FIG. 6 is a schematic diagram of a solid-state imaging device according to an embodiment of the present invention, particularly illustrating a third example of the wiring structure in detail. A solid-state imaging device 71 of the third example is provided with the imaging section 42 which includes the pixel output wiring 43 formed of metal wiring extending vertically on a first layer; and any two of the signal wirings, i.e. the transfer signal wiring 44 and reset signal wiring 45 in the present example, and the ground wirings 48 are formed with metal wirings extending horizontally on the second layer. Furthermore in the present example, the power supply wirings 47 and selection signal wirings 46 are formed with metal wirings on the third layer, and shading portions 53 in the shape of lattice are formed in combination of the power supply wirings 47 and selection signal wirings 46.

The power supply wirings 47 are formed having relatively large line width d3 extending vertically being in parallel to each other with a predetermined spacing therebetween enough for allowing photoelectric conversion elements provided in opening portions. The selection signal wirings 46 are formed extending horizontally having another large line width d4 (d3=d4, in the present example). The selection signal wirings 46 are formed to be partially apart from each other at the locations intersecting with the power supply wirings 47 and end portions thereof are interconnected at the locations by way of connection wirings 72 formed of metal on the second layer. With the power supply wirings 47 extending vertically and the selection signal wirings 46 extending horizontally, shading portions 53 in the shape of lattice are formed, which provides openings 52 at the locations spatially corresponding to photoelectric conversion elements 51 included in pixels. The power supply wirings 47 are interconnected using a wiring 73 at the end portions of the wirings 47.

The transfer signal wirings 44, reset signal wirings 45, and ground wirings 48, which are formed of metal wirings extending horizontally on the second layer, are provided in parallel to each other within the line width d4 of the selection signal wirings 46. However, since the connection wirings 72 are formed at the intersecting locations of the power supply wiring 47 and the selection signal wirings 46, the portions of the wirings provided on the both outer sides, i.e., the portions of the ground wirings 48 and transfer signal wirings 44 in the present example, are formed to be protruded partially onto the area of the openings 52 in the vicinity of the intersecting locations. Since other device features are similar to those of the first example, the repeated description thereof is herewith omitted.

According to the third example of wiring structure of the solid-state imaging device 71 of an embodiment of the invention, the shading portions 53 in the shape of lattice are formed having openings 52 at the locations spatially corresponding to photoelectric conversion elements 51 included in pixels using the power supply wirings 47 extending vertically and the selection signal wirings 46 extending horizontally, respectively formed with metal wirings on the third layer. The area of openings 52 provided in the shading portions 53 is large similarly to the first example compared with that previously known in the device structure of FIG. 3, the focusing efficiency can be improved and sensitivity is increased as much as the increase in the area of the openings.

In addition, by reducing the wiring density on the second layer, the coupling capacity between the ground wirings 48 and reset signal wirings 45 can be decreased, and the coupling capacity between the ground wirings 48 and the selection signal wirings 46 on the third layer can also be reduced. As a result, the fluctuation of ground potential is suppressed and the ground potential can be stabilized.

Furthermore, in the present example as well, the occurrence of shading is suppressed and the degradation of image quality resulted from the shading can also be suppressed. In addition, since the wiring density on the second layer is reduced compared with the previously known structure, it becomes feasible to achieve low resistance and low capacitance of the wirings, the effects of signal delay are reduced, and the degradation of image quality resulted from the signal delay can be suppressed.

Since the number of layers of wirings is kept as three that is the same as the example of FIG. 3, the reduction in device thickness can be implemented utilizing the relatively small distance between the receiving surface of photoelectric conversion element and the on-chip lens, and the sensitivity can be improved. With such a configuration, the number of wirings on the second layer can be decreased and flexibility can be increased in designing wiring schemes with due consideration to the reduction of vignetting.

The configurations of the first and second examples are more advantageous overall than the third example.

In the third example according to the embodiment, the wiring configuration may alternatively be provided by replacing the selection signal wiring 46 with either the transfer signal wiring 44 or the reset signal wiring 45. In addition, it may be feasible alternatively to form two wirings selected from the group including the pixel output wiring 43 and the drive wirings 44, 45, and 46 using lattice-shaped metal wirings on the third layer. Still in addition, the number of layers for wiring is not limited to three, but may alternatively be two, four, or larger.

The pixel transistors for forming the unit pixel are described in the above examples to assume the four-transistor circuit configuration including transfer, reset, amplifying, and selection transistors. According to an embodiment of the present invention, three-transistor circuit configuration including the transfer, reset, and amplifying transistors excepting the selection transistor may be employed. Furthermore, an embodiment of the present invention may be applied also to CMOS image sensors of the so-called pixel sharing type, in which the pixel transistors are shared by plural groups, each of the group is formed by including one photoelectric conversion element and one transfer transistor.

Next, in the solid-state imaging device according to the embodiments mentioned above, several configurations are described for supplying either a power supply, or both power supply and signals from the outside to different wirings on the third layer.

Prior to the description of the abovementioned supplying configurations, an example will be first described on a configuration, which is suitable for supplying different voltages, e.g., either power source, or both power source and ground, to different wirings on one layer, in comparison with the case previously known. This exemplary configuration can be utilized in the embodiments of the present invention.

Figure 7:
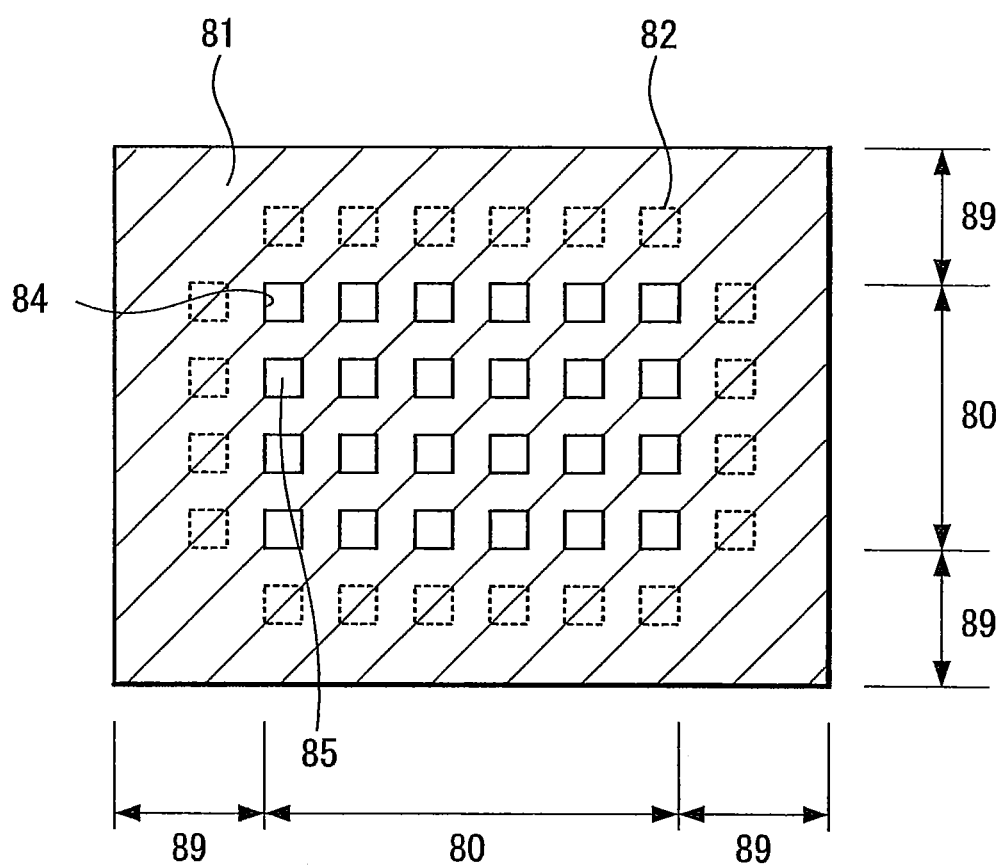
FIG. 7 is a schematic view illustrating a power source supply device according to the related art, provided for purposes of comparison.

In order to properly determine the luminance level of signals in a solid-state imaging device, it may be necessary to set a black level utilized as a standard. In order to determine the black level, an optical black pixel (hereinafter referred to as OPB pixel) is used, which is formed by shading a photodiode (PD) serving as photoelectric conversion element by means of metal wirings. Considering various different purposes of wiring layers each being specifically utilized in either the horizontal or vertical direction, it is suitable, for forming the shading metal wiring, to utilize the power supply wiring layer in the shape of lattice having openings spatially corresponding to each pixel. As illustrated in FIG. 7, OPB pixels 82 in OPB pixel region 89, which are covered by shading metal 81, are provided immediately outside effective pixels 85 to make proper reference to the characteristics of effective pixels 85 formed adjacent to openings 84 of the shading metal 81 in an effective pixel region 80. In addition, the OPB pixels 82 are formed on four sides, on the left, right, top and bottom, to cancel the difference in characteristics of the effective pixels 85, on the left, right, top and bottom, in the effective pixel region 80.

Considering determining the black level standard, it is preferable for the OPB pixels 82 and effective pixels 85 to be the same in their characteristics. However, because of the different in wiring patterns formed on the device, there may give rise to some deviation of characteristics resulted from the difference in electrical behaviors and/or manufacturing processes. In this case, the difference in characteristics can be offset by providing the OPB pixels 82 and effective pixels 85 with different power supplies. As illustrated in FIG. 7, when the shading metal in the OPB pixel region 89 is shared by the power supply wiring layer in the effective pixel region 80 and when one single power supply is used, the power supply can be taken out to the outside as it is. However, when different power supplies are provided separately to the effective pixels 85 and OPB pixels 82, it is necessary to separate wirings leading to respective pixels and to lead the power supplies to the outside individually.

Figure 8:
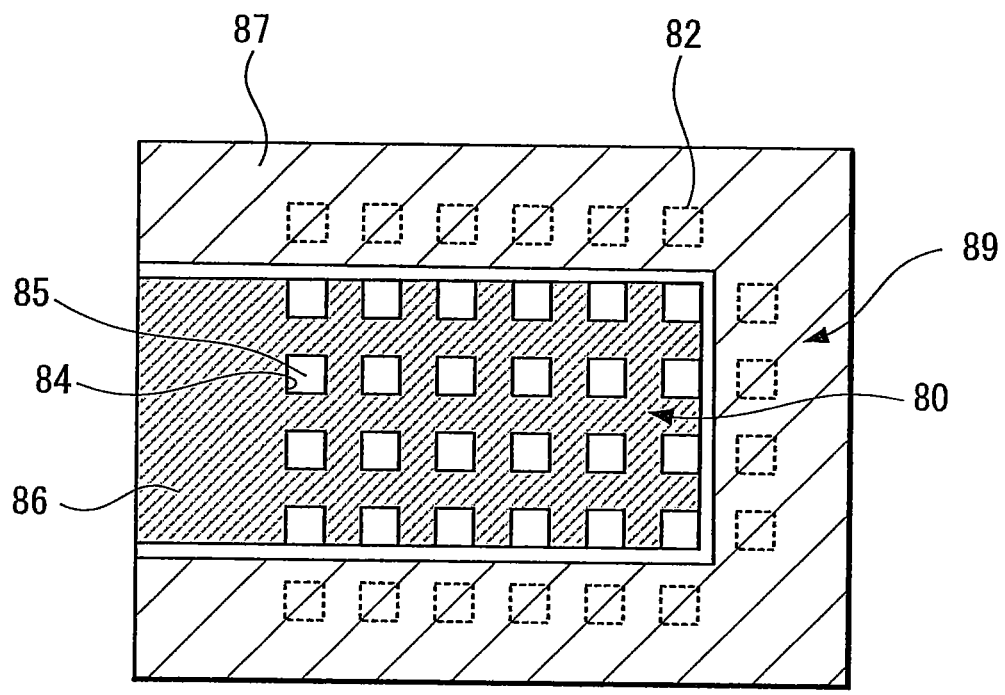
FIG. 8 is a schematic view illustrating a voltage supply device adapted to a solid-state imaging device according an embodiment of the present invention.

Since the effective pixels 85 are surrounded by the OPB pixels 82 as shown in FIG. 8, in the case where the power supply is led to the outside in use for the effective pixels 85, a structure is contemplated so that some parts of the OPB pixels 82 and of the shading metal 87, which are situated in the OPB pixel region 89 surrounding the effective pixels, are removed and that power supply wirings 86 to the effective pixels 85 in the effective pixel region 80 can be led to the outside through the thus removed parts. The shading metal 87 formed on the OPB pixel region 89 is used as power supply wirings to the OPB pixels 82.

However, when such structure is formed with the power supply wirings, 86 and 87, the power supply to the effective pixels 85 becomes asymmetric. As a result, the shading of a display screen is caused and the possibility may arise of lacking some pieces of information regarding to the difference of characteristics on the left, right, top and bottom portions, as much as the abovementioned OPB pixels 82 removed.

With regard to leading different power supplies to the outside, the same difficulty arises in the case of forming the power supply wiring 47 and the ground wiring 48 using metal wirings on the third layer, as described in the above-mentioned embodiments of the invention.

Figure 9:
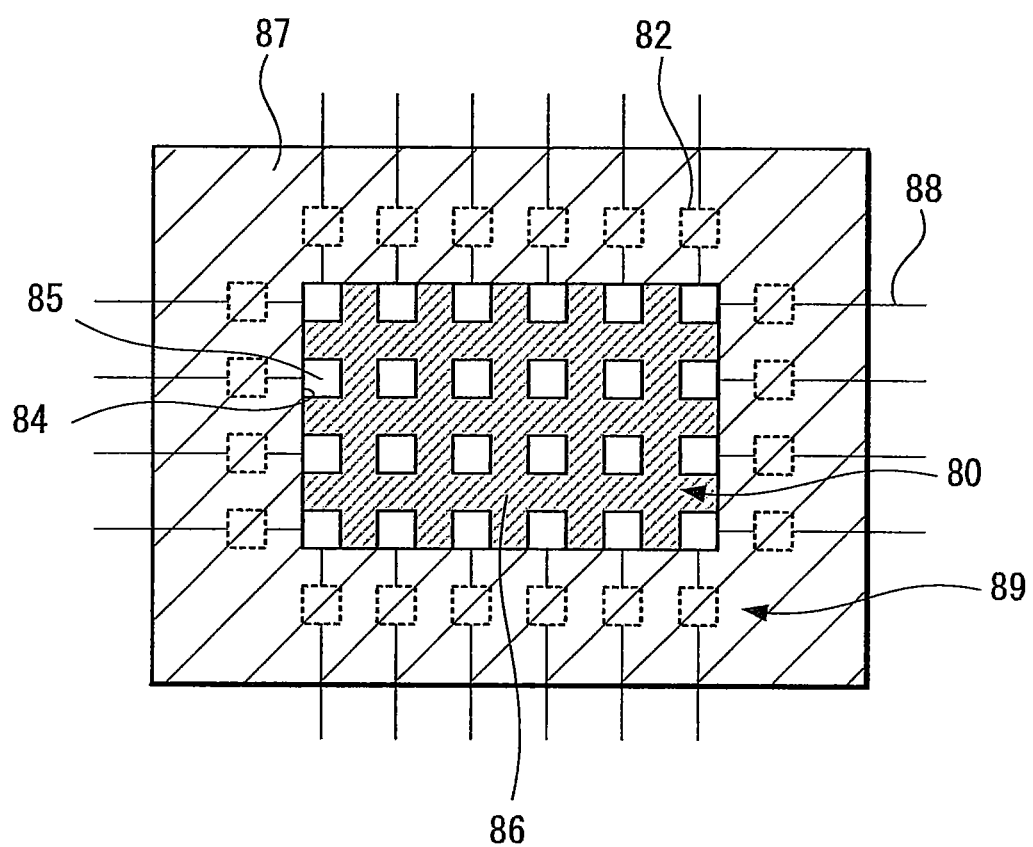
FIG. 9 is a schematic view illustrating a preferable example of a voltage/signal supply device adapted to a solid-state imaging device according an embodiment of the present invention.

Therefore, as shown in FIG. 9 according to an embodiment of the present invention, when the power supply for use in the effective pixel 85 is provided from the outside, a further structure other than the shading metal 87 is provided so that wiring layers 88 are each formed above the OPB pixels 82. With the present structure, the wiring layers 88 for leading the power supply wirings 86 in the effective pixel region 80 to the outside can be implemented symmetrically on the left, right, top and bottom. That is, different power sources can be supplied respectively to the OPB pixel region 82 and the effective pixel region 85, without removing the part of the OPB pixel region 82 and without causing any asymmetry in the power supply. However, in the case of the solid-state imaging device, for which it is difficult to additionally provide one wiring onto the pixel itself because of its small pixel size and to employ the device illustrated in FIG. 9, the power supply may alternatively be implemented with the structure shown in FIG. 8 so as for the wirings not to pass above the photodiodes.

Figure 10:
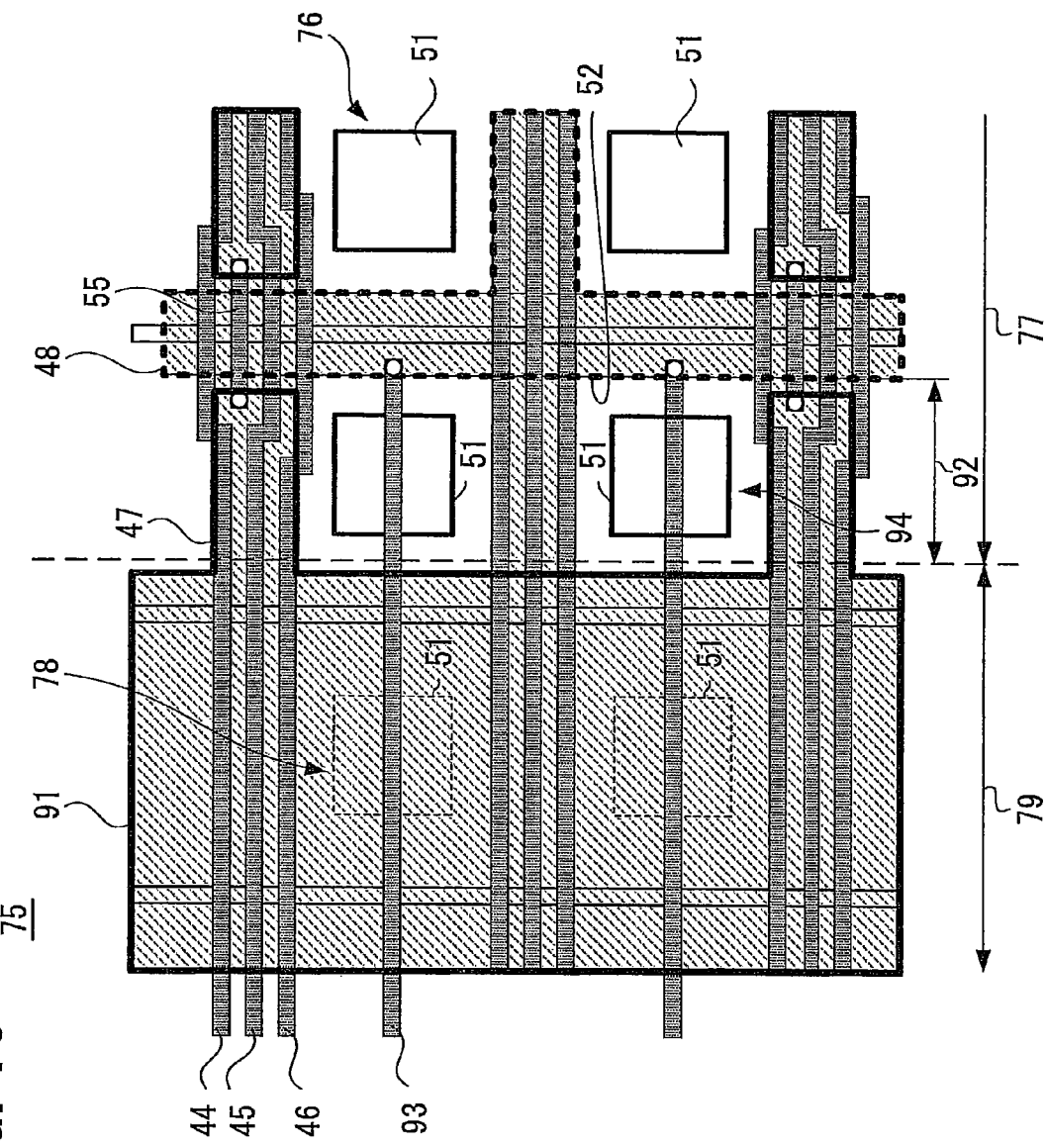
FIG. 10 is a schematic diagram illustrating a fourth example of major portions of a solid-state imaging device according to an embodiment of the present invention.

FIG. 10 is a schematic diagram illustrating a fourth example of the wiring structure according to an embodiment of the invention, in which the configuration illustrated in FIG. 9 for leading to the outside the power supply wirings and ground wirings is adapted to the aforementioned configuration of the first example for forming the power supply wirings 47 and ground wirings 48 using metal wirings on the third layer. A solid-state imaging device 75 according to the present example is provided by including the power supply wirings 47 in an effective pixel region 77 having effective pixels 76 arranged therein each including a photoelectric conversion element 51, in which the power supply wirings 47 are formed extending onto a OPB pixel region 79 having peripheral OPB pixels 78 arranged therein to be shared also as a shading metal 91.

In the effective pixel region 77, an ineffective pixel region 92 is formed adjacent to the OPB pixel region 79.

In addition, according to the present example, the ground wiring 48 in the effective pixel region 77 is provided by leading to the outside by way of metal wirings on the layer other than the third layer, i.e., voltage supply wirings 93 of metal wirings on the second layer in the present example. Also in the present example, the voltage supply wirings 93 serve as the wirings for supplying ground voltages. In this case, the voltage supply wirings 93 are formed to pass immediately above photoelectric conversion elements 51 provided in the ineffective pixel region 92 and in the OPB pixels 78. Moreover, as shown in FIG. 9, the voltage supply wirings 93 are formed so as to be symmetric on four sides, top and bottom, and left and right, and to pass above each opening 52 formed in the peripheral ineffective pixel region 92. With this structure, the power source voltage is supplied from the shading metal 91 in the peripheral OPB pixel region 79, while the ground voltage is supplied from the voltage supply wiring 93.

The wiring pattern of the power supply wiring 47 and the ground wiring 48 may alternatively be formed assuming the role thereof opposite to that of FIG. 10, in which the ground wiring 48 is formed extending onto the OPB pixel region 79 to be shared also as the shading metal on the OPB pixel region, and the power supply wiring 47 is provided by being led to the outside by way of the voltage supply wirings 93.

In the fourth example of the wiring structure of the solid-state imaging device 75 according to an embodiment of the invention, utilizing both the power supply wiring 47 and ground wiring 48 on the third layer formed to be symmetric on the top, bottom, left and right, different power sources and ground voltages can be supplied. By forming the voltage supply wiring immediately above photoelectric conversion elements in the OPB pixel region 79 for leading the ground wiring 48 to the outside, it is feasible to supply different voltages respectively to the OPB pixel region 79 and effective pixel region 77 without causing any asymmetry in the power supply and ground voltage supply even for pixels each having small cell size.

Figure 11:
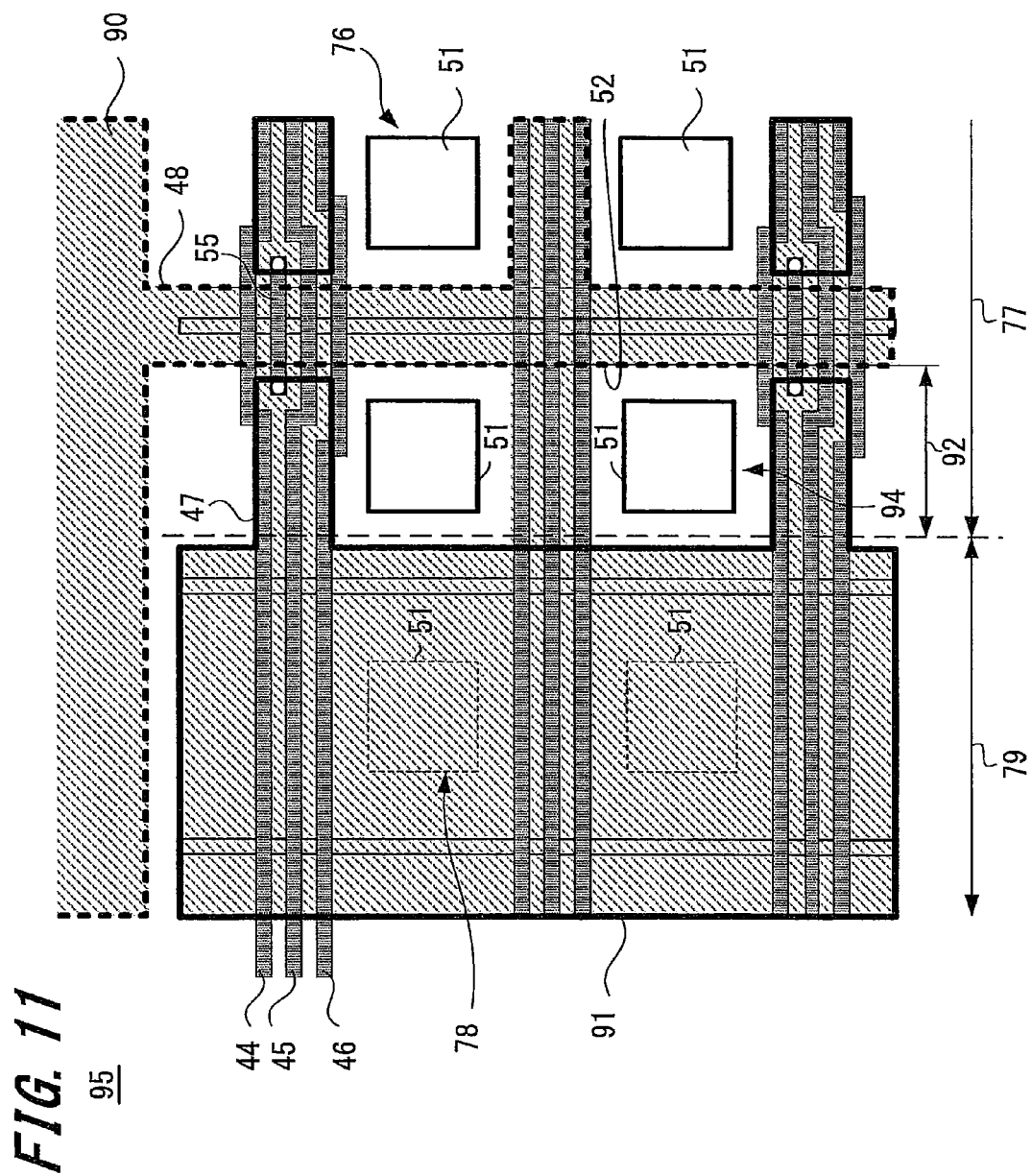
FIG. 11 is a schematic diagram illustrating a fifth example of major portions of a solid-state imaging device according to an embodiment of the present invention.

FIG. 11 is a schematic diagram illustrating a fifth example of the wiring structure according to an embodiment of the invention, in which the configuration illustrated in FIG. 8 for leading to the outside the power supply wirings and ground wirings is adapted to the aforementioned configuration of the first example for forming the power supply wirings 47 and ground wirings 48 using metal wirings on the third layer. A solid-state imaging device 95 according to the present example is provided by removing a part of OPB pixel region 79, and by extending, onto the thus removed part, either the power supply wiring 47 or ground wiring 48, i.e., the power supply wiring 47 in this example, to be shared as the shading metal 91. The other wiring, i.e., the ground wiring 48, extends onto the part of the OPB pixel region 79 excepting the removed part to be shared as the shading metal 90. The removed portion of the OPB pixel 78 may be formed only on one side as shown in FIG. 8, and the power supply wiring 47 may be formed extending only to one side. Alternatively, the removed portion of the OPB pixel 78 may be provided on both sides to be symmetric on the left and right, and the power supply wiring 47 is formed extending symmetrically to the both sides.

With the fifth example of the wiring structure of the solid-state imaging device 95 according to an embodiment of the invention, it becomes feasible to lead the power supply wiring 47 and the ground wiring 48 to the outside, which is suitably implemented in solid-state imaging devices particularly with small pixel size.

Figure 12:
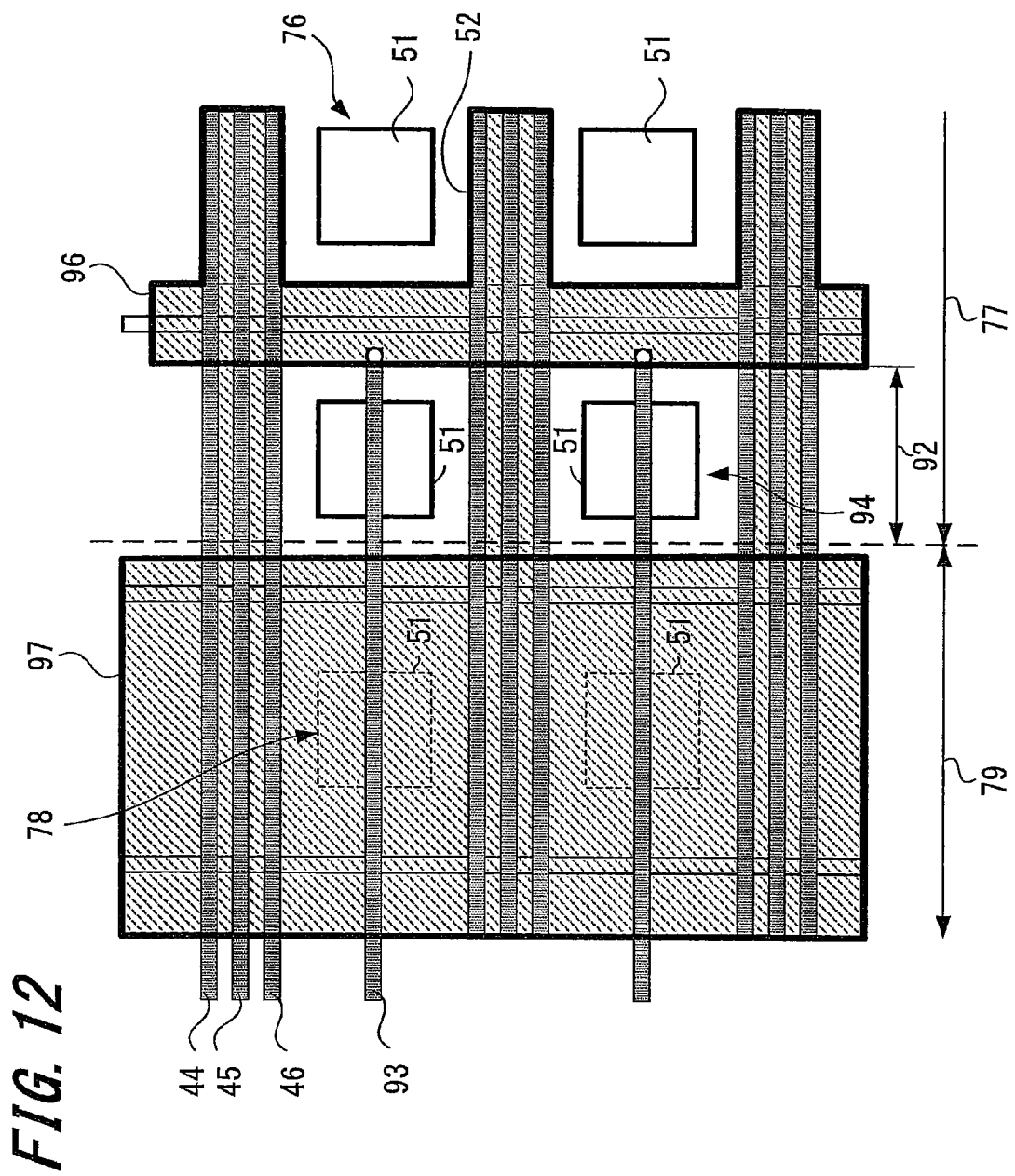
FIG. 12 is a schematic diagram illustrating an example suitably adapted to the case of different power supplies respectively for an effective pixel region and an OPB pixel region according an embodiment of the present invention.

FIG. 12 is a schematic diagram illustrating another example of the configuration according to an embodiment of the present invention, which is adapted to the case of different power supplies respectively for the effective pixel region 77 and the OPB pixel region 79 to be led to the outside. In the effective pixel region 77 excepting the ineffective pixel region 92, an effective pixel power supply wiring 96 in the shape of lattice is formed to also serve as shading, while a power supply wiring 97 for OPB pixels is formed in the OPB pixel region 79 to also serve as a shading metal. These effective pixel power supply wiring 96 and the OPB pixel power supply wiring 97 are formed using metal wirings on the third layer.

In addition, the power supply wiring 96 for effective pixels is configured to pass above photoelectric conversion elements provided in the ineffective pixel region 92 and the OPB pixels 78, and to be led to the outside by way of the voltage supply wiring 93 on another layer, i.e., metal wirings on the second layer in the present example. With the present structure, it is feasible to supply different voltages respectively to the power supply wiring 96 for effective pixels and power supply wiring 97 for OPB pixels, and the characteristics of the effective pixels 76 and OPB pixels 78 can be made proper reference with each other.

Figure 13:
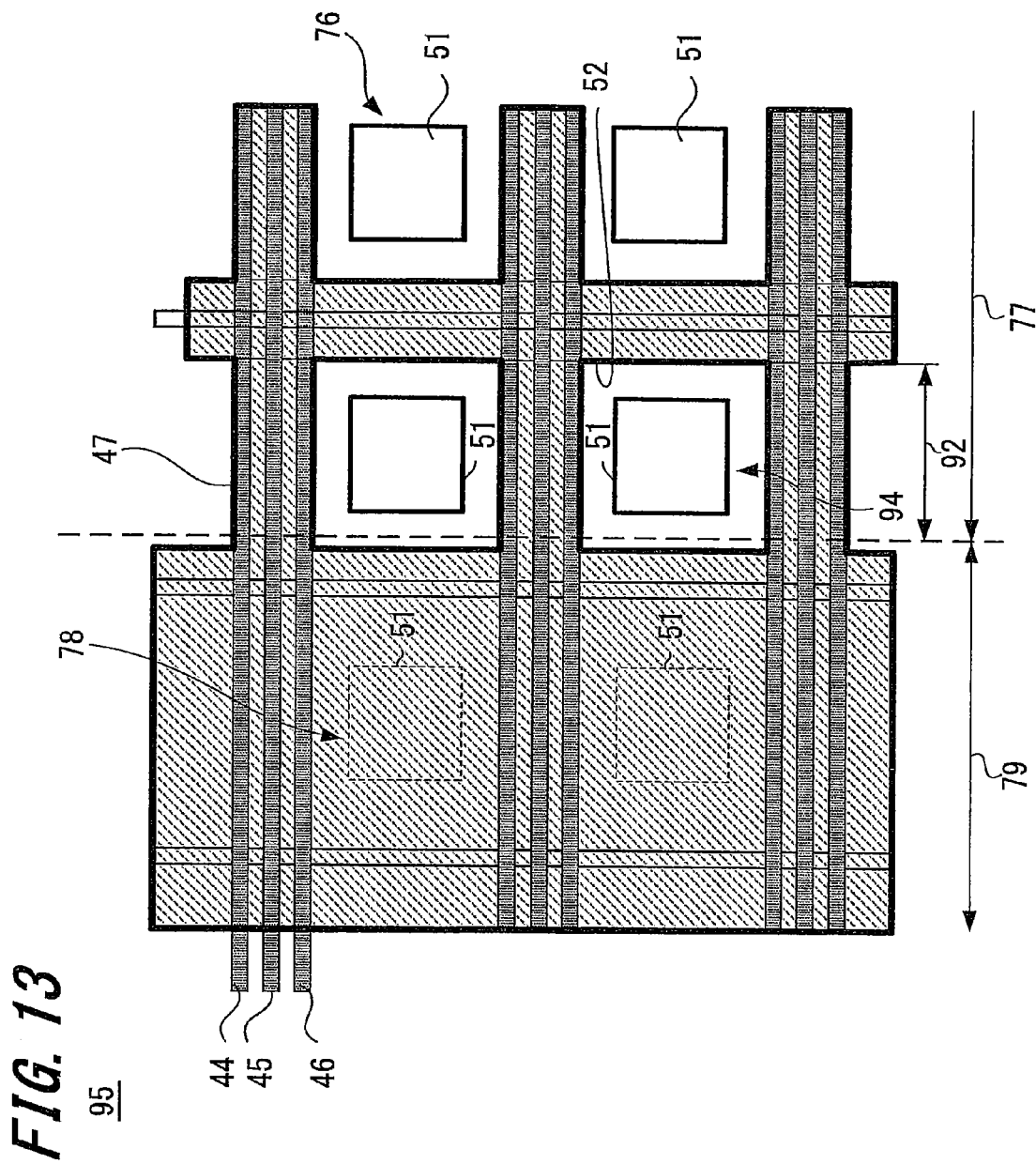
FIG. 13 is a schematic view, provided for purposes of comparison, illustrating a power source supply wiring according to the related art.

For purposes of comparison, FIG. 13 illustrates the example previously known for leading the power supply wiring to the outside corresponding to FIG. 7. In order to facilitate understanding, the portions included in FIG. 13 similar to those in FIGS. 10, 11, and 12 are shown with identical numerical representations. Referring to FIG. 13, the power supply wiring 47 serving also as the shading metal for the effective pixel region 77 is formed extending to the OPB pixel region 79. While the power supply wiring 47 serves also as the shading metal in the OPB pixel region 79, it is shared by the power source supply for the effective pixels 76 and OPB pixels 78.

Next, several examples of structure are described herein below for supplying two wirings respectively with either different voltages or voltage and signal, by way of metal wirings on the third layer. With regard to leading power supply wirings to the outside, when the shading metal in OPB pixel region is all formed with the same wiring, the above-mentioned supplies can usually be made directly from the outside of the OPB pixel region (in reference to FIG. 7). On the other hand, when the power supply is preferably divided into two, such as one for the effective pixel region and the other for the OPB pixel region, or one for the power supply wiring and the other for the ground wiring using metal wiring on the same layer, either a part of OPB pixel region 79 is removed or voltages are supplied to the asymmetric wiring structure (in reference to FIG. 8). In addition, although it may also be considered to pass the OPB pixel region by way of the layer other than the shading metal layer, it is difficult to implement this method for pixels with small cell size, since another wiring has to be added to effective pixels. However, when the configuration illustrated in FIG. 9 is adapted, source voltages can be supplied as desired even in the case of either dividing the power supply or providing the power supply and ground on the same layer, since the wirings outputting from the effective pixel region are formed immediately above photoelectric conversion elements provided in the OPB pixel region. For example, even in the solid-state imaging devices with small cell size, different voltages can be supplied to the wirings respectively in the OPB pixel region and effective pixel region both on the same layer, without removing the portion of OPB pixels and without causing any asymmetry in the voltage supply.

The structure illustrated in FIG. 9 is suitably adapted to the first, second, and third examples of wiring structure of the aforementioned solid-state imaging devices according to an embodiment of the invention. The structure of FIG. 8 is also adapted to the solid-state imaging devices of the first, second, and third examples.

While the methods of leading supply wirings to the outside have been illustrated herein above on those connecting the power source, ground, etc. to the effective pixel region, the present methods may also be adapted to drive circuit wirings and the like for desirably inputting from the outside of the OPB pixel region to the effective pixel region passing through the OPB pixel region.

Figure 14:
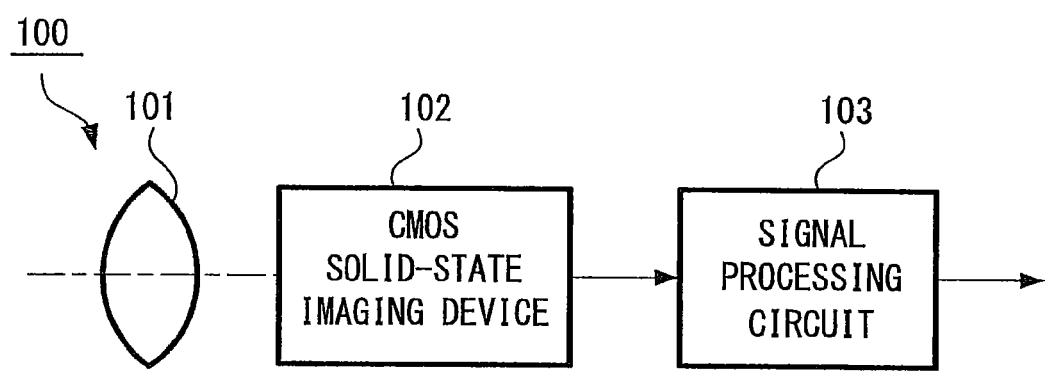
FIG. 14 is a schematic view illustrating the configuration of a camera according to an embodiment of the present invention.

FIG. 14 is a view illustrating a schematic configuration of a camera provided with the abovementioned solid-state imaging device according to an embodiment of the present invention. Referring to FIG. 14, a camera 100 according to the present embodiment is provided by including an optical system (optical lens) 101, a solid-state imaging device 102, and a signal processing circuit 103. As to the solid-state imaging device 102, any one of the devices described in the aforementioned embodiments, and the device provided with the first example or the fourth example of wiring structure may preferably be adapted. The optical system 101 is configured to implement image formation on the imaging surface of the solid-state imaging device 102 with image light (incident light) emanated from the subject. Signal charges are accumulated for a fixed period of time by the photoelectric conversion element included in the solid-state imaging device 102. The signal processing circuit 103 is configured to provide the signals outputted from solid-state imaging device 102 with various signal processing, and output as picture signals. The camera 100 according to the present embodiment may also include a camera module which is formed by modularizing the optical system 101, the solid-state imaging device 102, and the signal processing circuit 103.

With the camera 100 according to the present embodiment, picture images of high sensitivity and high quality can be provided since this camera incorporates the solid-state imaging device according to an embodiment of the present invention.

According to an embodiment of the present invention, it is also feasible to provide various electronic devices such as, for example, mobile devices typified by mobile phones, incorporating the aforementioned camera or camera module illustrated in FIG. 14. With the electric devices according to the embodiments of the invention, high performance electric devices can be provided since the cameras are included being capable of providing picture images of high sensitivity and high quality.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device, comprising:
a camera;
the camera including a solid-state imaging device,
an optical system configured to lead incident light to a photoelectric conversion element included in the solid-state imaging device, and
a signal processing circuit configured to process output signals from the solid-state imaging device;
the solid-state imaging device including
an imaging region including pixels arranged two-dimensionally, each of the pixels including a photoelectric conversion element and a plurality of pixel transistors for reading out signals outputted from the photoelectric conversion element, and
wirings formed on stacked layers for driving each of the pixels, wherein
a shading part between the pixels is formed by combining first and second wirings selected from the wirings,
the first and the second wirings are formed each having wiring directions intersecting with each other,
the first and second wirings in the solid-state imaging device are formed on a single layer, and
the first wiring at a location intersecting the second wiring is interconnected by way of connection wirings on a layer different from that of the first wiring.

2. An electronic device according to claim 1, wherein
the first and second wirings in the solid-state imaging device are a power supply wiring and a ground wiring; and
each formed in a lattice shape partially apart from each other to be combined so that portions are formed as a further lattice structure, each of the portions having an opening spatially corresponding to the photoelectric conversion element included in each of the pixels.

3. An electronic device according to claim 2, further comprising:

an optical black pixel, which includes a photoelectric conversion element that is shielded from the incident light; and
a voltage supply wiring that is connected to one of the power supply wiring and the ground wiring,
wherein the voltage supply wiring passes immediately above the photoelectric conversion element included in the optical black pixel.

4. A solid-state imaging device, comprising:
a pixel including a photoelectric conversion element formed in a substrate; and
a shading part having an opening, the opening being configured to allow incident light to impinge on the photoelectric conversion element,
wherein the shading part includes a first wiring and a second wiring, wherein
the first wiring and the second wiring are formed in a first layer, and
portions of the first wiring intersect portions of the second wiring, and at a point of intersection of the portion of the first wiring and the portion of the second wiring, a first portion of the first wiring is connected to a second portion of the first wiring with a connecting portion, the connecting portion being formed in a second layer, the second layer being different in height from the substrate than the first layer.

5. A solid-state imaging device according to claim 4, wherein
the first wiring and the second wiring are formed in a lattice shape, the first wiring being formed toward a first side of the opening and the second wiring being formed toward a second side of the opening.

6. A solid-state imaging device according to claim 5, wherein
the first wiring is a power supply wiring and the second wiring is a ground wiring.

7. A camera, comprising:
a solid-state imaging device according to claim 5;
an optical system configured to lead the incident light to the photoelectric conversion element; and
a signal processing circuit configured to process output signals from the solid-state imaging device.

8. An electronic device, comprising:
a camera, the camera including the solid-state imaging device according to claim 5,
an optical system configured to lead the incident light to the photoelectric conversion element, and
a signal processing circuit configured to process output signals from the solid-state imaging device.

9. A solid-state imaging device, comprising:
a substrate;
pixels formed on an upper surface of the substrate that are configured to sense incident light; and
wirings configured to drive the plurality of pixels, the wirings including first and second wirings,
wherein the first and second wirings together form a shading part that defines respective optical openings for the pixels,
the first and second wirings are configured such that, from a perspective perpendicular to the upper surface of the substrate, an outline of the first wirings intersects an outline of the second wirings at a plurality of intersection regions, and
the first and second wirings are both formed in a first layer except at the plurality of intersection regions, where at each of the intersection regions one of the first and second wirings is formed in the first layer and the other of the first and second wirings is formed in a second layer different from the first layer.

10. A solid-state imaging device according to claim 9, wherein, from the perspective perpendicular to the upper surface of the substrate, the outline of the first wirings forms a first lattice shape and the outline of the second wirings forms a second lattice shape offset from the first lattice shape such that an outline of the shading part forms a third lattice shape.

11. A solid-state imaging device according to claim 9, wherein each of the first wirings extends in a first direction and each of the second wirings extends in a second direction perpendicular to the first direction.

12. A solid-state imaging device according to claim 11, wherein at each intersection region the first wirings are formed in the first layer, and
the second wirings include interconnect portions that are formed in the second layer and primary portions that are formed in the first layer, each of the interconnect portions being located at one of the intersection regions and being configured to connect two of the primary portions to each other.

13. A solid-state imaging device according to claim 9, wherein
the first wirings are power supply wirings and the second wirings are ground wirings.

14. A solid-state imaging device according to claim 13, further comprising:
an optical black pixel, which includes a photoelectric conversion element that is shielded from the incident light; and
a voltage supply wiring that is connected to one of the power supply wiring and the ground wiring,
wherein the voltage supply wiring passes immediately above the photoelectric conversion element of the optical black pixel.

15. A solid-state imaging device according to claim 13, wherein the pixels are arranged in an effective pixel region,
the solid-state imaging device further comprises optical black pixels that each include a photoelectric conversion element that is shielded from the incident light, the optical black pixels being arranged in an optical black region in the periphery of the effective pixel region,
a part of the optical black region does not include optical black pixels, forming a removed part,
one of the power supply wiring and the ground wiring is extended from the effective pixel region into the removed part, and
the other of the power supply wiring and the ground wiring is extended from the effective pixel region into the optical black region so as to shield the respective photoelectric conversion elements of the optical black pixels from the incident light.

16. A solid-state imaging device according to claim 9, further comprising:
an optical black pixel, which includes a photoelectric conversion element that is shielded from the incident light; and
a voltage/signal supply wiring that is connected to one of the first and second wirings,
wherein the voltage/signal supply wiring passes immediately above the photoelectric conversion element of the optical black pixel.

17. A solid-state imaging device according to claim 9, wherein the pixels are arranged in an effective pixel region,
the solid-state imaging device further comprises optical black pixels that each include a photoelectric conversion element that is shielded from the incident light, the optical black pixels being arranged in an optical black region in the periphery of the effective pixel region,
a part of the optical black region does not include optical black pixels, forming a removed part,
one of the first and second wirings is extended from the effective pixel region into to the removed part, and
the other of the first and second wirings is extended from the effective pixel region into the optical black region so as to shield the optical black pixels from the incident light.

18. A camera, comprising:
the solid-state imaging device of claim 9;
an optical system configured to lead incident light to one of the pixels included in the solid-state imaging device; and
a signal processing circuit configured to process output signals from the solid-state imaging device.

19. An electronic device, comprising:
a camera, the camera including:
the solid-state imaging device of claim 9;
an optical system configured to lead incident light to one of the pixels included in the solid-state imaging device; and
a signal processing circuit configured to process output signals from the solid-state imaging device.

* * * * *